United States Patent [19]

Seevinck et al.

[11] Patent Number: 4,992,755
[45] Date of Patent: Feb. 12, 1991

[54] TRANSISTOR CIRCUIT

[75] Inventors: Evert Seevinck; Jan Dikken; Hans-Jürgen Schumacher, all of Eindhoven, Netherlands

[73] Assignee: U.S. Philips Corporation, New York, N.Y.

[21] Appl. No.: 467,340

[22] Filed: Jan. 19, 1990

Related U.S. Application Data

[63] Continuation-in-part of Ser. No. 352,425, May 16, 1989, abandoned.

[30] Foreign Application Priority Data

Jan. 17, 1989 [NL] Netherlands ................. 8900095

[51] Int. Cl.$^5$ ............................................. H03F 3/45
[52] U.S. Cl. ......................................... 330/253; 330/257; 330/258; 330/259
[58] Field of Search ............... 330/253, 257, 258, 259; 307/475

[56] References Cited

U.S. PATENT DOCUMENTS 4,427,903  1/1984  Sugimoto ................. 330/253 X

OTHER PUBLICATIONS

Allen et al., "CMOS Analog Circuit Design", p. 274, Published by Holt, Rinehart and Winston, Inc.

Primary Examiner—James B. Mullins
Attorney, Agent, or Firm—Bernard Franzblau

[57] ABSTRACT

A transistor circuit comprising a first differential amplifier which is composed of a differential pair and a current mirror. The transistor circuit further comprises a second differential amplifier which measures a differential offset voltage in the first differential amplifier and reduces this offset voltage by means of common mode current feedback. The transistor circuit thus provides a stable amplifier having a high speed and a low offset voltage which can be used advantageously in a logic output buffer so that, for example, an ECL output buffer can be realized in CMOS.

29 Claims, 3 Drawing Sheets

TRANSISTOR CIRCUIT

This is a continuation-in-part of application Ser. No. 352,425, filed May 16, 1989, now abandoned.

BACKGROUND OF THE INVENTION

This invention relates to a transistor circuit, comprising a first and a second transistor which are connected as a first differential amplifier and which are coupled to a common node via a common electrode, an input network of a current mirror being included in a main channel of the first transistor via a first output terminal, an output network of said current mirror being included in a main channel of the second transistor via a second output terminal.

A circuit of the kind set forth is known from FIG. 6.2-1 on page 274 of "CMOS Analog Circuit Design", 1987, by Alan and Holberg, published by Holt, Rinehart and Winston, Inc. A differential amplifier is described which comprises a first transistor M1, a second transistor M2 and a current mirror which is composed of transistors M3 and M4. The described differential amplifier quickly responds to variations of the input signals $V_{G1}$ and $V_{G2}$, so that this amplifier has a short response time. However, it also has a comparatively high input offset voltage which is detrimental, notably for the amplification of ECL signals. When the gain of the differential amplifier is increased the input offset voltage is generally reduced. However, when the gain is increased, the response of the amplifier to a step-like signal variation at its input (step response) exhibits more overshoot when the amplifier is fed back in an output buffer. This is often undesirable in practice, particularly when the circuit is used for the amplification of digital (ECL) signals.

SUMMARY OF THE INVENTION

It is one object of the invention to provide a transistor circuit in which the response time of a differential amplifier does not exceed that of the amplifier in accordance with the state of the art, but in which the step response of the fed back transistor circuit exhibits no, or substantially no, overshoot and the input offset voltage of the differential amplifier is substantially lower.

To achieve this, a transistor circuit in accordance with the invention is characterized in that it also comprises a second differential amplifier, a first and a second input of which are coupled to the first and the second output terminal, respectively, an output of said second differential amplifier being coupled to controllable current conductor means for the common mode supply of current to and the common mode draining of current from the first and the second output terminal.

A transistor circuit in accordance with the invention offers the advantage that the second differential amplifier amplifies an offset voltage on the output of the first differential amplifier and drives controllable current conductor means via its output, so that the common mode supply of current to the first and the second output terminal or the common mode draining of current from the first and the second output terminal reduces the offset voltage on the output of the first differential amplifier. As a result, the input offset voltage of the first differential amplifier also decreases when the output of the differential amplifier is fed back to its input, for example, in a logic output buffer comprising such a differential amplifier. Moreover, no or hardly any overshoot occurs in the step response of the fed back transistor circuit because a low gain can now be chosen for the first differential amplifier. The offset voltage is no longer linked to the gain of the first differential amplifier.

An embodiment of a transistor circuit in accordance with the invention is characterized in that a first response time of a signal variation on the first and the second output terminal in reaction to an input signal variation of the first differential amplifier is shorter than a second response time of a signal variation on the output of the second differential amplifier in reaction to a signal variation on the first and the second output terminal. As a result, in the case of a variation of the difference input signal an offset voltage on the output of the first differential amplifier will be amplified by the second differential amplifier only after a delay, so that the offset voltage is reduced by the current conductor means only after this delay. This prevents unstable behaviour of the transistor circuit in the fed back condition and also prevents undesirable oscillations.

A transistor circuit in accordance with the invention is a circuit in which an offset voltage occurring is reduced. Such a circuit can also be successfully used in analog circuits. However, hereinafter only the use of a transistor circuit in accordance with the invention in a logic output buffer will be described by way of example.

BRIEF DESCRIPTION OF THE DRAWINGS

The invention will be described in detail hereinafter with reference to the accompanying diagrammatic drawing; in which.

DESCRIPTION OF THE PREFERRED EMBODIMENTS

Figure 1:
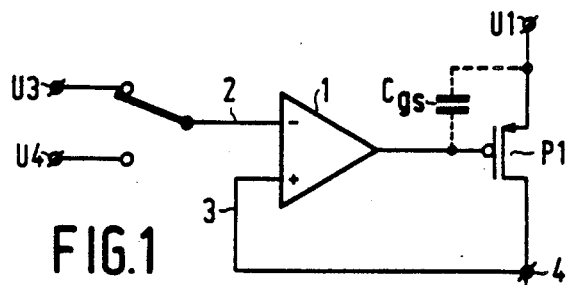
FIG. 1 shows a known logic output buffer which includes a differential amplifier.

FIG. 1 shows a logic output buffer. The output buffer comprises a known differential amplifier 1 and a PMOS transistor P1. The output of the differential amplifier 1 is connected to the gate of the transistor P1. The source of the transistor P1 is connected to a first power supply terminal U1 and the drain of the transistor P1 is connected to an output terminal 4 and is retrocoupled to the non-inverting input 3 of the differential amplifier 1. The inverting input 2 of the differential amplifier 1 receives an input signal originating from a voltage terminal U3 or U4. Between the output terminal 4 and a power supply terminal U5 (for example, −2 V in the case of ECL circuits) there is connected a load impedance $Z_o$.

The circuit shown in FIG. 1 operates as follows. The differential amplifier 1 tends to make the input voltage on the inputs 2 and 3 equal by way of the transistor P1 and the feedback. When the input voltages on the inputs 2 and 3 are equal, therefore, the output voltage on the output terminal 4 will be equal to the input voltage on the input 2 of the differential amplifier 1. The voltage on the output terminal 4 "tracks" as it were the voltage on the input 2. The accuracy of "tracking" of the input voltage, however, depends on the gain factor of the differential amplifier 1. When the gain factor is higher or lower, the "tracking" accuracy will be higher and lower, respectively.

However, when the differential amplifier 1 has a high gain factor, the circuit shown in FIG. 1 is liable to become unstable and may start to oscillate because of the parasitic capacitance Cgs of the transistor P1 and the capacitive load $Z_o$, if any. However, when a differential amplifier 1 having a slightly lower gain factor is used, a substantial overshoot will inevitably occur in the step response; notably in the case of a logic output buffer such overshoot is often undesirable.

Figure 2A:
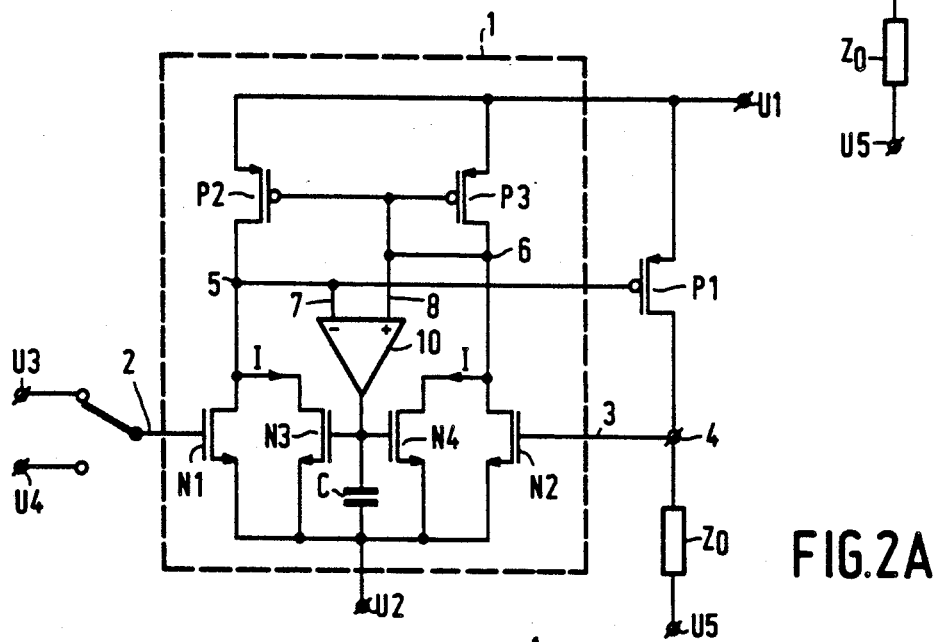
FIG. 2A shows an embodiment of a logic output buffer comprising a transistor circuit in accordance with the invention.

FIG. 2A shows an embodiment of a logic output buffer in accordance with the invention in which the described drawbacks do not occur. Elements which correspond to elements of FIG. 1 are denoted by the same reference symbols. The differential amplifier 1 now comprises the following elements: a differential amplifier 10, two PMOS transistors P2 and P3, four NMOS transistors N1 to N4, and one capacitor C. The sources of the transistors P2 and P3 are connected to one another and to the supply terminal U1. The gates of the transistors P2 and P3 are connected to one another and to a non-inverting input 8 of the differential amplifier 10. The gates of the transistors P2 and P3 are also connected to the drain of the transistor P3 and to the drain of the transistor N2. The drain of the transistor P2 is connected, Via a node 5, to the inverting input 7 of the differential amplifier 10, to the gate of the transistor P1, and to the drain of the transistor N1. The drainS of the transistors N1 and N3, N2 and N4, respectively, are connected to one another. Moreover the sources of the transistors N1, N2, N3 and N1 are connected to one another and to a power supply terminal U2. Between the interconnected gates of the transistors N3 and N4 and the second power supply terminal U2 there is connected a capacitor C. The gates of the transistors N1 and N2 receive the input signal 2 and the input signal 3, respectively. A logic output buffer in accordance with the invention can be used advantageously in an integrated circuit.

The operation of the logic output buffer shown in FIG. 2A is as follows. The gate of the transistor N1 receives a voltage originating from the voltage terminal U3 or U4. The voltage terminal U3 and the voltage terminal U4 carry voltages of, for example, $-0.9$ V and $-1.7$ V, respectively, with respect to the power supply terminal U1 for signals which are in conformity with standards for emitter-coupled logic signals (ECL). As has already been stated, the transistors N1, N2 and P2, P3 form a known differential amplifier.

In the absence of the components 10, N3, N4 and C in the differential amplifier 1, an offset voltage would occur between the nodes 5 and 6 as has already been mentioned.

In accordance with the invention, the differential amplifier 10 detects the offset voltage present between the nodes 5 and 6 and applies this offset voltage in amplified form to the gates of the transistors N3 and N4.

When a voltage on the node 6 exceeds that on the node 5, the output signal of the differential amplifier 10 is positive so that the transistors N3 and N4 are turned on. As a result, an additional current I is drained from the nodes 5 and 6. Because this additional current I is drained from the supply terminal U1 by the transistors P2 and P3, the voltage between the gate and the source of the transistors P2 and P3 increases. Because of the common gate and drain connection of the transistor P3, the voltage on the node 6 then decreases. The voltage on the node 5, however, is not or is only slightly dependent on the current through the transistor P2. The additional current I through the transistor P3 is also produced in the transistor P2 by the connection of transistors P2 and P3 as a current mirror. The transistor N3, however, also drains a current 1, so that the node 5 is not additionally charged. Because the voltage on the node 6 decreases and that on the node 5 remains the same, the differential amplifier 10 and the transistors N3 and N4 minimize and at least substantially eliminate an offset voltage.

The capacitor C, connected between the gates of the transistors N3 and N4 and the second power supply terminal U2, substantially completely determines the response time of the second differential amplifier 10 in reaction to a signal variation on the input terminals 7 and 8. Consequently, in reaction to a signal variation on the gate 2 of the transistor N1, the offset voltage on the nodes 5 and 6 is eliminated only after a delay time. Thus, on the one hand the feedback loop formed by the differential amplifier 10 and the transistors N3 and N4 is prevented from introducing instability in the transistor circuit, while on the other hand the offset voltage is still eliminated after the delay time. Because the sources of the transistors N1 and N2 are connected directly to the power supply terminal U2, the offset voltage between the nodes 5 and 6 is also lower than if the sources of the transistors N1 and N2 were connected to the power supply terminal U2 via a current source.

Figure 2B:
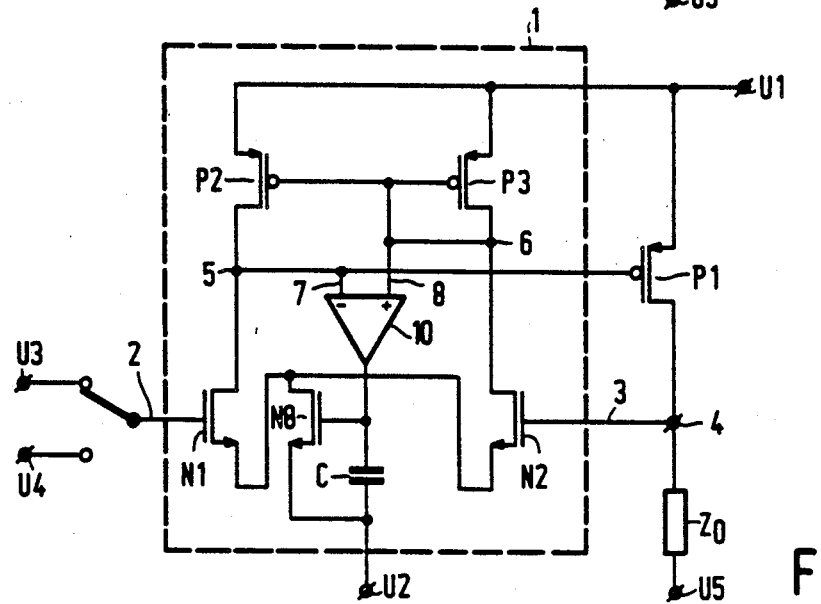
FIG. 2B shows a further embodiment of a logic output buffer comprising a transistor circuit in accordance with the invention.

FIG. 2B shows another embodiment of a logic output buffer in accordance with the invention. The output buffer corresponds substantially completely to that described with reference to FIG. 2A, except that the transistors N3 and N4 have been replaced by a single NMOS transistor N8. The sources of the transistors N1 and N2 are no longer directly connected to the second supply terminal (U2). Instead, they are connected to the second power supply terminal U2 via the channel of the transistor N8. The gate of the transistor N8 is connected to the output of the differential amplifier 10.

The operation of the logic output buffer shown in FIG. 2B substantially corresponds to that of the logic output buffer shown in FIG. 2A. When the transistor N8 is turned on by the differential amplifier 10, additional currents I are drained from the nodes 5 and 6. The value of these additional currents will be substantially equal because of the mirror effect of the transistors P2 and P3. Consequently, the transistor N8 carries a current I2.

Figure 3:
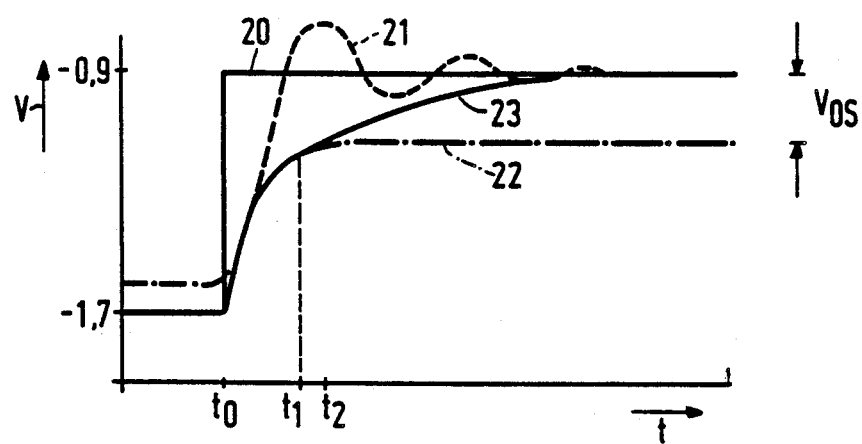
FIG. 3 shows a voltage/time diagram illustrating the variation of a number of signals occurring in the transistor circuit shown in FIG. 2.

FIG. 3 shows a voltage/time diagram illustrating the output signal step response which may occur in the logic output buffer of FIGS. 1 and 2. Signal 20 is applied as the input signal to the input terminal 2 of the differential amplifier 1. At the instant $t_0$ it changes from a logic low level ($-1.7$ V) to a logic high level ($-0.9$ V).

A signal 21, denoted by a broken line, represents the voltage variation as a function of time on the input terminal 3 of the differential amplifier 1 if this differential amplifier 1 did not include the second differential amplifier 10 with the transistors N3, N4 and the capacitor C and the gain of the differential amplifier 1 was high. Because of the high gain of the differential amplifier 1 the voltage of the signal 21 ultimately becomes equal to the voltage of the signal 20, so that ultimately the offset voltage is very low or equal to zero. However, at the instant $t_1$ the signal 21 exhibits substantial overshoot with respect to the input signal 20. In a logic output buffer (for example, suitable for ECL standardized signal levels) such an overshoot is unacceptable or at least undesirable. When the gain is even higher, the signal 21 spontaneously starts to oscillate continuously.

The signal 22, denoted by a stroke-dot line, again illustrates the voltage variation as a function of time on the input terminal 3 of the differential amplifier 1. The differential amplifier 1 again does not include a second differential amplifier 10 with the transistors N3, N4 and the capacitor C. The gain of the differential amplifier 1 in the present embodiment is much lower than the gain of the differential amplifier 1 in the example described in the preceding paragraph where the signal 21 is the output signal. Contrary to the signal 21 in the preceding example, the signal 22 does not exhibit overshoot, but it does not reach a voltage level which is equal to the ultimate voltage of the input signal 20. In this case an offset voltage $V_{OS}$ exists. This offset voltage $V_{OS}$ is also undesirable in logic output buffers because the output of the logic output buffer should very accurately "track" its input.

The signal 23, represented by a solid line, however, illustrates the voltage variation as a function of time on the input terminal 3 of the differential amplifier 1 in accordance with the invention. The signal 23 tracks the signal 22 at and briefly after the instant $t_0$. Because of the delay introduced by the differential amplifier 10, the transistors N3 and N4 are not yet turned on so that during this period the signal 23 is determined exclusively by the elements N1, N2, P2 and P3 in the differential amplifier 1. The gain of these elements is chosen to be small. After the instant $t_1$, the RC delay of the differential amplifier 10 and the capacitor C being approximately equal to $t_1 - t_0$, the operation of the differential amplifier 10 and the transistors N3, N§becomes effectively noticeable. A difference voltage $V_{OS}$ is reduced and ultimately becomes substantially zero. The logic output buffer in accordance with the invention, therefore, does not exhibit overshoot and no offset voltage is present either.

Figure 4:
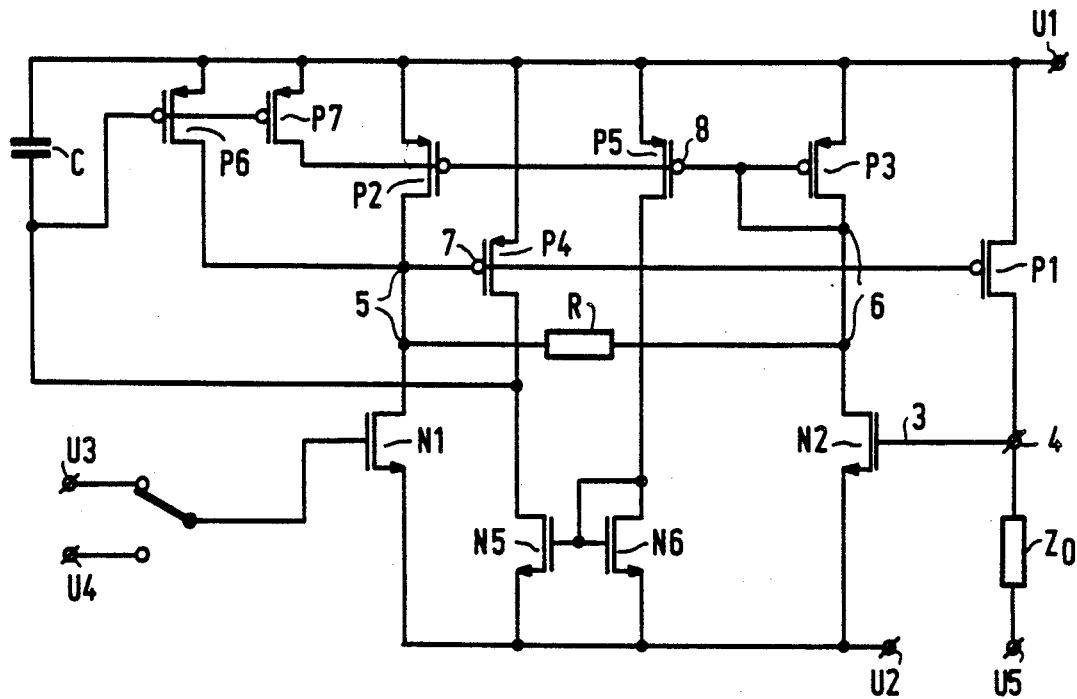
FIG. 4 shows a preferred embodiment of an output buffer comprising a transistor circuit in accordance with the invention.

FIG. 4 shows a preferred embodiment of a logic output buffer in accordance with the invention. The circuit shown in FIG. 4 corresponds substantially to that shown in FIG. 2A and elements which correspond to elements shown in the FIGS. 1 and 2 are denoted by corresponding reference numerals. The differential amplifier 10 is realized by way of two PMOS transistors P4 and P5 and two NMOS transistors N5 and N6. A resistor R is connected between the nodes 5 and 6. The NMOS transistors N3 and N4 of FIG. 2A have been replaced by two PMOS transistors P6 and P7, the sources of the transistors P6 and P7 being connected to the first power supply terminal. The capacitor C is connected between the common gates of the transistors P6 and P7 and the first power supply terminal U1. The sources of the transistors P4 and P5 are connected to the first power supply terminal U1. The gate of the transistor P4 and that of the transistor P5 form the inverting input 7 and the non-inverting input 8, respectively, of the differential amplifier 10. The drain of the transistor P4 forms the output of the differential amplifier 10 and is connected to the drain of the transistor N5. The drain of the transistor P5 is connected to the drain of the transistor N6 and to the gates of the transistors N5 and N6. The sources of the transistors N5 and N6 are connected to the second power supply terminal U2.

The operation of the logic output buffer shown in FIG. 4 corresponds mainly to the operation of the logic output buffer shown in FIG. 2A. The differential amplifier 10 of FIG. 2 is in this case realized in known manner by way of transistors P4, P5, N5 and N6. The resistor R connected between the nodes 5 and 6 serves to reduce the gain of the amplifier stage which is composed of the transistors N1, N2, P2 and P3. As has already been stated, this precludes overshoot in the step response of this amplifier stage. An offset voltage between the nodes 5 and 6 is at least substantially eliminated by the differential amplifier 10 (composed of the transistors P4, P5, N5 and N6) and the transistors P6 and P7, as has already been described with reference to FIG. 2.

Figure 5:
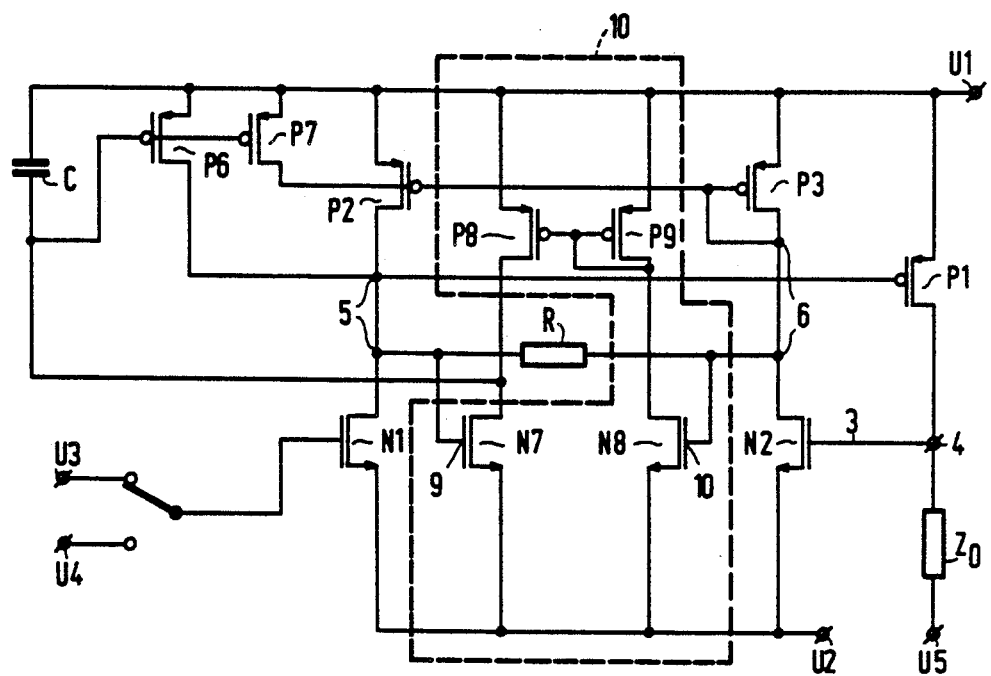
FIG. 5 shows another embodiment of an output buffer comprising a transistor circuit in accordance with the invention.

FIG. 5 shows another embodiment of an output buffer comprising a transistor circuit in accordance with the invention. The circuit shown in FIG. 5 corresponds substantially to that shown in FIG. 4. Elements of FIG. 5 which correspond to elements of FIG. 4 are denoted by corresponding reference numerals and symbols. The circuit shown in FIG. 5 deviates from that of FIG. 4 in that the transistors P4, P5, N5 and N6 have been replaced by transistors P8, P9, N7 and N8. These transistors again form a differential amplifier 10 as shown in FIGS. 2A and 2B. However, the transistors N7 and N8 now form the input transistors of the differential amplifier and the transistors P8 and P9 form the current mirror. The sources of the transistors P8 and P9 are connected to the first power supply terminal U1. The gates of the transistors P8 and P9 are connected to one another and to the drain of the transistor P9. The drains of the transistors P8 and P9 are connected to the drains of the transistors N7 and N8, respectively. The gate of the transistor N7 is connected to the node 5 and the gate of the transistor N8 is connected to the node 6. The sources of the transistors N7 and N8 are connected to the second power supply terminal U2.

The operation of the logic output buffer shown in FIG. 5 is similar to the operation of the logic output buffer shown in FIG. 4. The differential amplifier 10 is in this case realized in known manner by way of the transistors P8, P9, N7 and N8. Simulations have demonstrated that in comparison with the output buffer shown in FIG. 4, the logic output buffer shown in FIG. 5 is more accurate in its ability to cope with changes in temperature and effects due to process tolerances.

A transistor circuit in accordance with the invention can be successfully used in an ECL compatible output buffer where the transistor circuit is constructed in CMOS technology.

We claim:

1. A transistor circuit comprising a first and a second transistor connected as a first differential amplifier and coupled to a common node via a common electrode, a current mirror having an input network connected to a main channel of the first transistor via a first output terminal, an output network of said current mirror being connected to a main channel of the second transistor via a second output terminal, a second differential amplifier having a first and second input coupled to the first and the second output terminal, respectively, an output of said second differential amplifier being coupled to controllable current conductor means for the common mode supply of current to and the common mode draining of current from the first and the second output terminal.

2. A transistor circuit as claimed in claim 1, wherein a first response time of a signal variation on the first and the second output terminal in reaction to an input signal variation of the first differential amplifier is shorter than a second response time of a signal variation on the output of the second differential amplifier in reaction to a signal variation on the first and the second output terminal.

3. A transistor circuit as claimed in claim 2, wherein the controllable current conductor means are coupled to the first and to the second output terminal.

4. A transistor circuit as claimed in claim 3, wherein the controllable current conductor means comprise a third and a fourth transistor having control electrodes connected to the output of the second differential amplifier, means connecting a channel of the third and the fourth transistor between the first and second output terminal, respectively, and a power supply terminal.

5. A transistor circuit as claimed in claim 2, wherein the second differential amplifier comprises a third and a fourth transistor connected as a differential amplifier and coupled, by way of respective control electrodes, to the first and the second output terminals, respectively, a main channel of the third transistor including an input network of a further current mirror, an output network of which is connected in a main channel of the fourth transistor via the output of the second differential amplifier.

6. A transistor circuit as claimed in claim 1 wherein the controllable current conductor means are coupled to the first and to the second output terminal.

7. A transistor circuit as claimed in claim 6, wherein the controllable current conductor means comprise a third and a fourth transistors having control electrodes connected to the output of the second differential amplifier, means connecting a channel of the third and the fourth transistor between the first and second output terminal, respectively, and a power supply terminal.

8. A transistor circuit as claimed in claim 7 wherein said control electrodes are also coupled to a power supply terminal via a capacitive element.

9. A transistor circuit as claimed in claim 6 wherein the controllable current conductor means are coupled to the common node.

10. A transistor circuit as claimed in claim 9, wherein the controllable current conductor means comprise a third transistor having a control electrode connected to the output of the second differential amplifier, a channel of the third transistor being connected between the common node and a power supply terminal.

11. A transistor circuit as claimed in claim 1 wherein the second differential amplifier comprises a third and fourth transistor connected as a differential amplifier and which are coupled, by way of respective control electrodes, to the first and second output terminal, respectively, a main channel of the third transistor including an input network of a further current mirror, an output network of which is included in a main channel of the fourth transistor via the output of the second differential amplifier.

12. A transistor circuit as claimed in claim 11, wherein the third and the fourth transistor are of n-type conductivity.

13. A transistor circuit as claimed in claim 1 further comprising a resistor coupled between the first and the second output terminal.

14. A logic output buffer comprising a transistor circuit as claimed in claim 1.

15. A transistor circuit as claimed in claim 1, wherein the controllable current conductor means are coupled to the common node.

16. A transistor circuit as claimed in claim 15, wherein the controllable current conductor means comprise a third transistor having a control electrode connected to the output of the second differential amplifier, a channel of the third transistor being connected between the common node and a power supply terminal.

17. A transistor circuit as claimed in claim 16 wherein said control electrode is also coupled to a power supply terminal via a capacitive element.

18. A transistor circuit as claimed in claim 1 wherein the common node is connected directly to a power supply terminal.

19. A transistor circuit comprising:
first and second transistors connected as a first differential amplifier with a main electrode of each transistor connected in common to a circuit node,
a current mirror having an input branch and an output branch connected in first and second series circuits with said first and second transistors, respectively,
a second differential amplifier having first and second inputs coupled to first and second output terminals, respectively, of the first differential amplifier,
a controllable current conductor means for the common mode supply of current to and the common mode draining of current from the first and the second output terminals of the first differential amplifier, and
means coupling an output of said second differential amplifier to said controllable current conductor means in a manner so as to reduce an offset voltage, if present, at said output terminals of the first differential amplifier.

20. A transistor circuit as claimed in claim 19 further comprising a feedback circuit coupling at least one of said output terminals of the first differential amplifier to a control electrode of one of said first and second transistors of the first differential amplifier.

21. A transistor circuit as claimed in claim 20 wherein the feedback circuit includes a third transistor and said first and second transistors comprise MOS field effect transistors of one polarity and said current mirror comprises fourth and fifth MOS field effect transistors of opposite polarity to that of said first and second transistors and connected in said input branch and said output branch, respectively.

22. A transistor circuit as claimed in claim 20 further comprising a signal input terminal coupled to a control electrode of the other one of said first and second transistors.

23. A transistor circuit as claimed in claim 20 further comprising a resistor coupled between the first and second output terminals of the first differential amplifier.

24. A transistor circuit as claimed in claim 19 further comprising a capacitor coupled to said output of the second differential amplifier and to said circuit node of the first differential amplifier thereby to delay the response of the second differential amplifier relative to that of the first differential amplifier.

25. A transistor circuit as claimed in claim 19 wherein said controllable current conductor means comprise third and fourth transistors coupled between said first and second output terminals of the first differential amplifier and said circuit node, and wherein said coupling means connects the output of the second differential amplifier to control electrodes of the third and fourth transistors.

26. A transistor circuit as claimed in claim 19 wherein said controllable current conductor means comprise a third transistor coupled between said circuit node and a power supply terminal of the transistor circuit, and wherein said coupling means connects the output of the second differential amplifier to a control electrode of the third transistor.

27. A transistor circuit as claimed in claim 19 wherein the second differential amplifier comprises third and fourth transistors, said transistor circuit further comprising a second current mirror having an input branch and an output branch connected in third and fourth series circuits with said third and fourth transistors, respectively.

28. A transistor circuit as claimed in claim 27, wherein the third and the fourth transistor are of n-type conductivity.

29. A transistor circuit as claimed in claim 19 wherein said first and second series circuits are connected in parallel between first and second terminals of a source of DC supply voltage, and further comprising a capacitor coupled to said output of the second differential amplifier and to one of said first and second terminals of the DC supply voltage.

* * * * *